United States Patent [19]

Tsu et al.

[11] Patent Number: 4,569,697
[45] Date of Patent: Feb. 11, 1986

[54] METHOD OF FORMING PHOTOVOLTAIC QUALITY AMORPHOUS ALLOYS BY PASSIVATING DEFECT STATES

[75] Inventors: Raphael Tsu, Troy; Stanford R. Ovshinsky, Bloomfield Hills; Jesus Hernandez, Royal Oak; Denis Martin, Rochester, all of Mich.

[73] Assignee: Energy Conversion Devices, Inc., Troy, Mich.

[21] Appl. No.: 526,831

[22] Filed: Aug. 26, 1983

[51] Int. Cl.$^4$ .................... H01L 21/203; H01L 31/18
[52] U.S. Cl. ..................... 148/1.5; 148/174;
427/51; 427/74; 427/85; 427/86; 136/258; 136/249; 357/2
[58] Field of Search ................. 148/1.5, 171, 174, 177, 148/178, 186, 189; 427/51, 74, 85, 86; 29/572; 136/258 AM, 249 TJ; 357/2, 30; 252/62.3 R, 62.3 E, 501.1; 420/556, 578, 903

[56] References Cited

U.S. PATENT DOCUMENTS

| | | | |
|---|---|---|---|
| 4,151,058 | 4/1979 | Kaplan et al. | 204/192 S |
| 4,217,374 | 8/1980 | Ovshinsky et al. | 427/39 |
| 4,342,044 | 7/1982 | Ovshinsky et al. | 427/39 |
| 4,402,762 | 9/1983 | John et al. | 148/1.5 |

OTHER PUBLICATIONS

J. Jang et al., "Hydrogenation and Doping of Vacuum--Evaporated A-Si", *J. Non Crystalline Solids*, vols. 35–36, pp. 313–318 (1980).

V. Premachandran et al., "Chlorine Implantation into Amorphous Germanium", *Thin Solid Films*, vol. 88, pp. 335–338 (Feb. 1982).

G. Nakamura et al., "High Efficiency Tandem Type Solar Cells Consisting of A-Si:H and A-SiGe:H, *Proceedings, 4th E.C. Photovoltaic Solar Energy Conf.* (1982), Reidel Pub. Co., pp. 616–620.

D. Kaplan et al., "Hydrogenation of Evaporated Amorphous Silicon by Plasma Treatment", *Appl. Phys. Lett.*, vol. 33, pp. 440–442 (1978).

*Primary Examiner*—Aaron Weisstuch
*Attorney, Agent, or Firm*—Marvin S. Siskind; Ronald W. Citkowski

[57] ABSTRACT

Relatively dense, photovoltaic quality amorphous alloys which are characterized by reduced density of defect states in the band gaps thereof and which are particularly suited for use in tandem photovoltaic devices are formed by evaporating amorphous germanium and amorphous silicon in an ultrahigh vacuum environment, diffusing a density of states reducing element into and through the amorphous material, and finally annealing the resultant amorphous alloy to complete the diffusion process. The amorphous alloy, so formed, is a substantially contaminant-free, substantially tetrahedrally coordinated material. Fluorine is the preferred density of states reducing element which is added to the amorphous material for reducing the density of states through compensation, and for orbital promotion and expansion.

33 Claims, 9 Drawing Figures

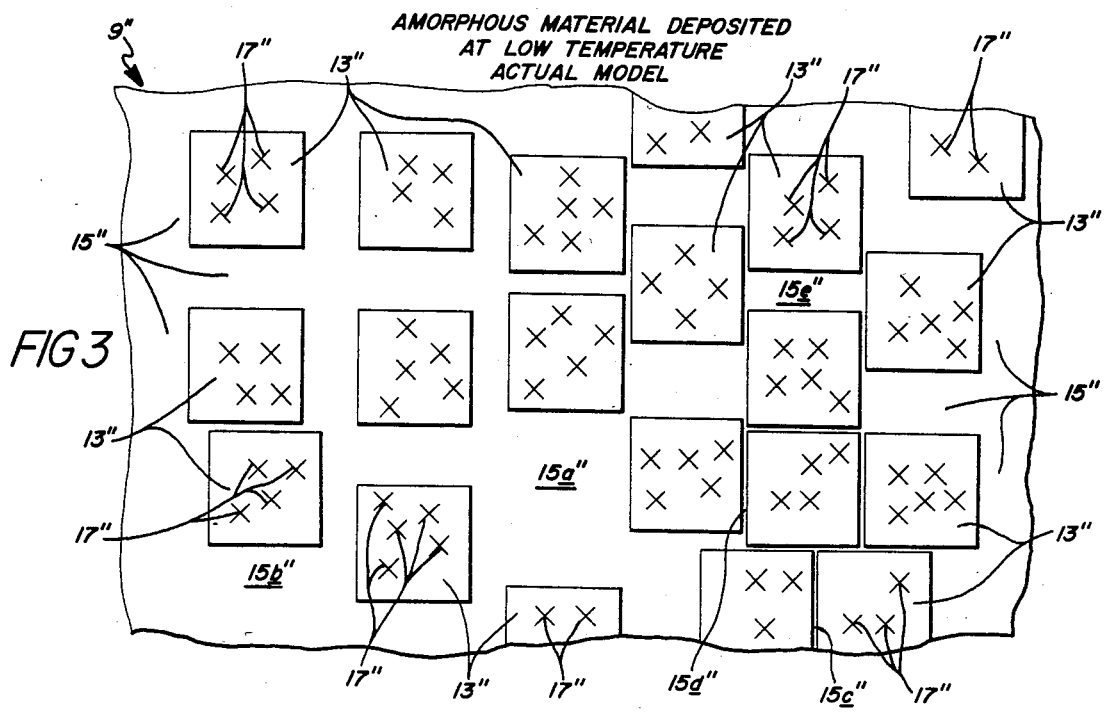
FIG 3 AMORPHOUS MATERIAL DEPOSITED AT LOW TEMPERATURE ACTUAL MODEL
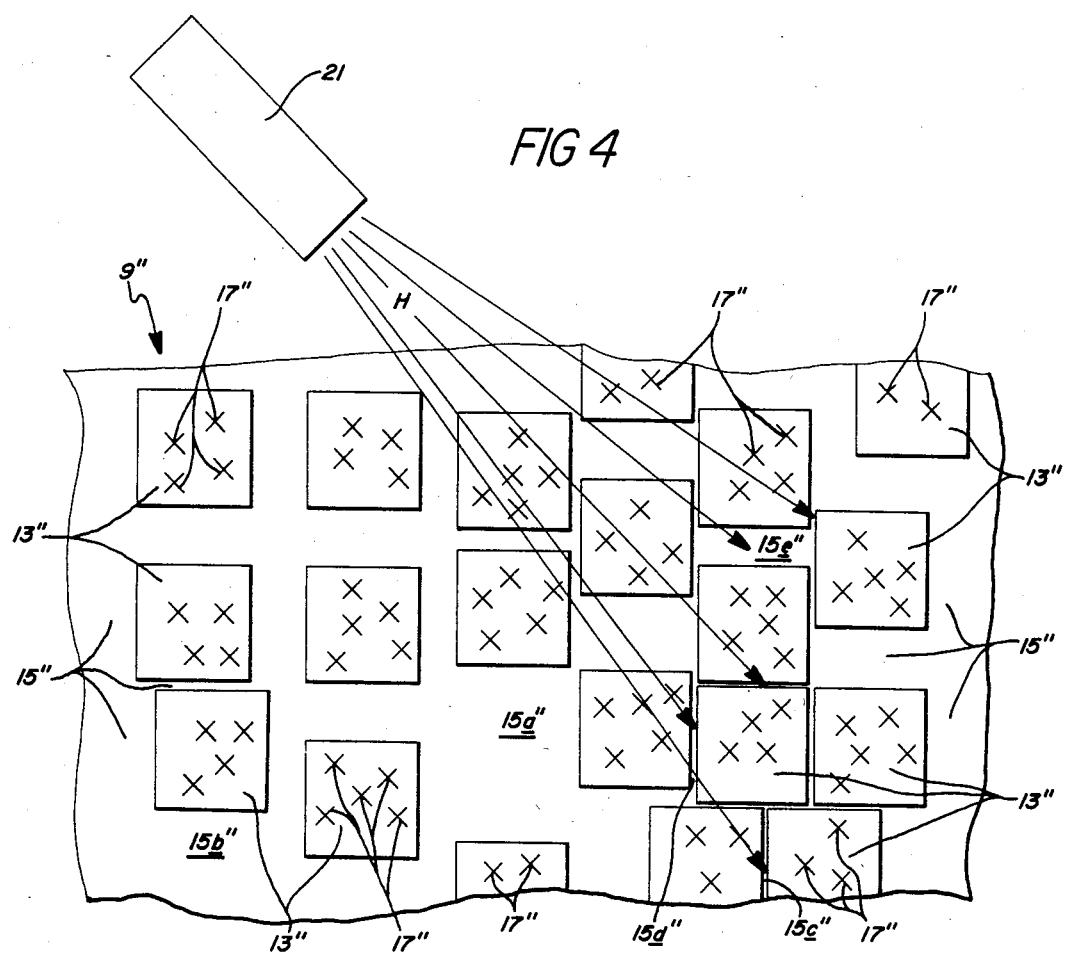
FIG 4

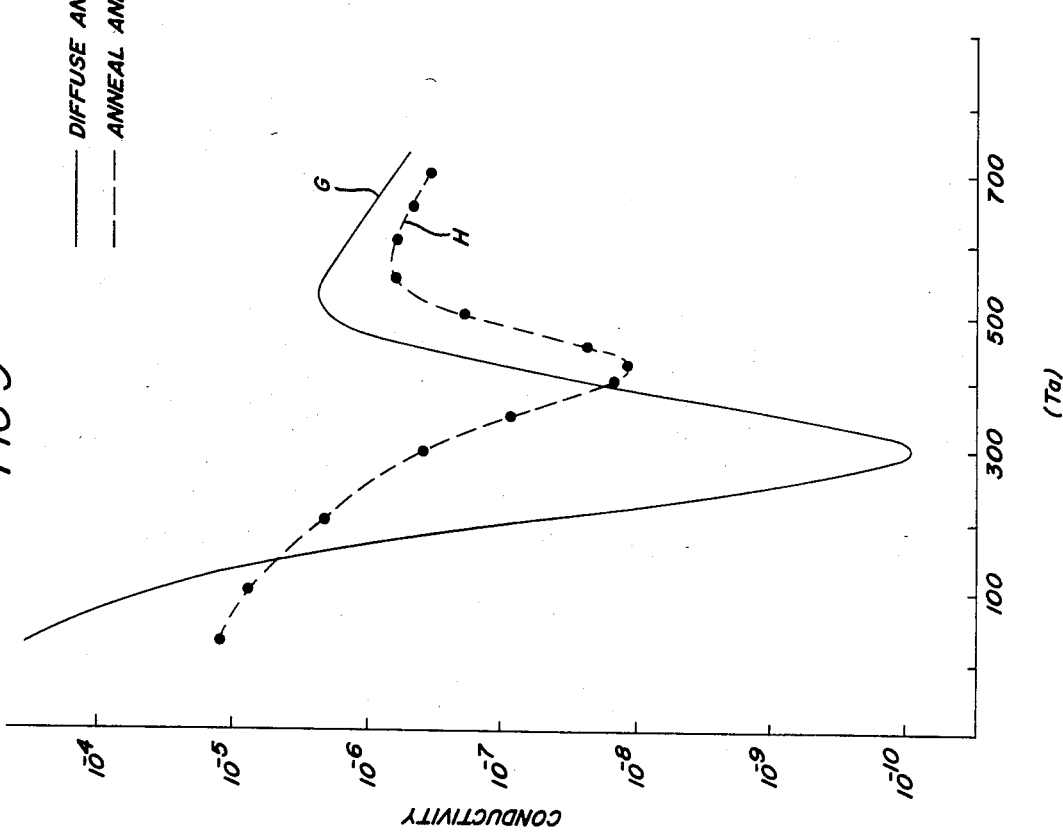

METHOD OF FORMING PHOTOVOLTAIC QUALITY AMORPHOUS ALLOYS BY PASSIVATING DEFECT STATES

FIELD OF THE INVENTION

This invention relates generally to amorphous semiconductor materials and more particularly to a method of producing amorphous semiconductor alloys having a range of band gaps which are characterized by reduced density of defect states therein. Also included herein are the photovoltaic quality amorphous semiconductor alloys produced by the inventive method of the instant application.

BACKGROUND OF THE INVENTION

Disclosed herein is a method of producing photovoltaic quality amorphous alloys which are characterized by a low density of defect states in the energy gaps thereof and good electrical, optical and mechanical properties. As used herein, "density of defect states" is defined as the number of defect states, or deep electronic trap sites such as dangling bonds, per unit volume in the band gap of a given material.

Amorphous alloys, such as amorphous silicon alloys and amorphous germanium alloys, have previously been produced by glow discharge plasma deposition, chemical vapor deposition, evaporation and sputtering processes. While these processes will be referred to in greater detail hereinafter, it is sufficient for purposes of the instant discussion to note that the amorphous alloy materials so produced have a relatively high density of defect states in the energy gaps thereof. Since a significant industrial use of the amorphous silicon and germanium alloys is in the production of semiconductor devices such as photovoltaic cells, it is important that the alloys used to fabricate the photovoltaic cells provide, inter alia, good electrical transport properties. However, amorphous alloys having a high density of defect states in the energy gaps thereof are characterized by a large number of deep electronic trap sites which result in low drift mobility and short lifetimes for the recombination of free carriers. Amorphous semiconductors are extremely attractive alternatives to crystalline semiconductors because they (1) can be produced as large area devices, and (2) possess a band gap with a high value for the optical absorption coefficient as compared to the direct band gap of crystalline materials. It is therefore extremely important for the density of defect states at the Fermi level of the amorphous semiconductor alloys to be reduced in order for amorphous semiconductors to compete in a cost effective manner with their crystalline counterparts.

Whereas it now possible to provide the wider band gap amorphous alloys with an acceptably low, although not optimized, density of defect states, it is the narrow band gap alloys (about 1.2eV and below) which have yet to be produced with a sufficiently low density of defect states to make photovoltaic quality films therefrom. It is believed the reason photovoltaic quality low band gap alloys have not as yet been produced is because (1) the environment in which these low band gap amorphous materials have been deposited was contaminated by a great variety of unwanted species and impurities and (2) the previous methods of combining the precursor materials were not effected so as to optimize tetrahedral coordination of the deposited amorphous alloy. The numerous impurities produced by, as well as the parameters involved with, plasma deposition, evaporation, sputtering etc. are inherently uncontrollable, and therefore these processes are unable to provide the extremely high efficiency 30% cells which are theoretically possible.

Since the lowest energy state of amorphous solids such as silicon and germanium occurs if those solids recombine in crystalline form, the aforementioned methods of depositing amorphous alloys resulted in the deposition of a low density, porous amorphous material that contained a great number of vacancies and voids. In order to provide a high, photovoltaic quality amorphous alloy, it is therefore necessary to modify known methods of deposition so as to either (1) reduce the number of vacancies and voids, or (2) make these vacancies and voids become a helpful part of the process. Only by improving the number of vacancies and voids can a high density, low defect material characterized by good transport properties be produced.

Before proceeding further, note that amorphicity is a generic term referring only to a lack of long range periodicity. In order to understand amorphous materials, the stoichiometry of the material, the type of chemical bonding, the number of bonds generated by the local order (its coordination), and the influence of the entire local environment upon the resulting varied configurations contained in the amorphous solid must be considered. Amorphous materials, rather than being viewed as a random packing of atoms characterized as hard spheres, should be thought of as composed of an interactive matrix influenced by electronic configurations. If, however, one is able to outwit the normal relaxations of the amorphous material and utilize the available three-dimensional freedom of the amorphous state, entirely new amorphous materials may be fabricated. Of course, this creation of new amorphous materials requires the use of new processing techniques.

The inescapable conclusion to be derived from the foregoing is that by properly coordinating process parameters, it should be possible to create deviant, but desirable, electronic configurations of amorphous materials. In order to understand this concept, it must be realized that amorphous materials have several different bonding configurations as available energetic options. For instance, elemental amorphous silicon, although normally tetrahedrally coordinated, has some atoms which are not tetrahedrally bonded. Local order is always specific and coexists in several configurations in every amorphous material. Steric and isomeric considerations are involved both with factors influencing amorphicity and with those creating defects in the materials. The constraints in amorphous materials are involved with assymetrical, spatial and energetic relationships of atoms permitted by the varying three dimensional chemical and geometrical possibilities afforded by an amorphous solid. In such a solid there is not only a spectrum of bonding which spans from metallic to ionic, but a spectrum of bond strengths. A major factor involved in the spectrum of bond strengths is the competitive force of the chemical environment which acts to influence and alter the bond energy. Based on the foregoing, it should be apparent that a greater number of weaker bonds are presented in an amorphous material than in its crystalline counterpart.

There exists an important energetic process that leads a material toward amorphicity. More specifically, the preferred chemical bonding of atoms and the field produced by nonbonding electrons can give a molecular structure a proclivity toward an anticrystalline state. The geometries or shapes of these structures are complex, distorted ones formed by localized pressures, repulsions and attractions of surrounding forces. These forces cause compression in one area, elongation in a second, twisting in a third, all in contradistinction to the perfectly repetitive crystalline cell. These tangled networks also include crosslinks and bridging atoms and are constrained by electron orbital relationships including (1) lone or inert pair electrons, and (2) the chemical influence, mechanical presence and the spatial relationships of nearest neighbors. It can therefore be appreciated that the energetic considerations necessary to complete coordination depend upon the ability to spatially and energetically mate bonding positions. This is the reason why elemental silicon (being tetrahedrally coordinated) has a greater number of dangling bonds, weakened bonds and voids than its crystalline counterparts. This gives rise to the concept of utilizing other elements such as hydrogen and fluorine to passivate those defects. While silicon:hydrogen alloys possess more complete bonding units, the substitution or addition of fluorine for hydrogen will provide the amorphous alloy with greater stability and improved electrical properties.

In amorphous alloys the normal equilibrium bonding can be disturbed by creating new configurations through the addition of a compensating element or elements with multi-orbital possibilites. For instance, alloying permits the optical band gap to be tailored for specific applications and yet permits chemical modification or doping by affecting defect states in the gap, thereby controlling electrical conduction. Alloys can be made by using many possible elements, including multi-orbital modifiers such as d-band elements. The orbitals of such elements can enter the bonding matrix, but, more importantly, can eliminate or create states in the energy gap. Therefore, the elimination of the crystalline constraints permits a greater variety of bonding and antibonding orbital relationships than are present in a crystalline solid and represents the key in the synthesization of new amorphous materials.

In summation, the transport properties of amorphous materials are characterized by deviant bonding directly involved with fluctuations of coordination and directionality of the bonding and nonbonding orbitals. The interaction of these spatially and energetically varied orbitals in three-dimentional space provides the opportunity for unusual electronic excitation and recombination mechanisms. It is the chemical and structural basis of amorphous materials that permits the utilization of the "super halogenicity" of fluorine for its organizing and expanding influence to manipulate size and charge of various atoms, and to design atomic and molecular configurations best suited for specific purposes.

In other words, it is possible to synthesize and independently control all relevant characteristics of amorphous alloys such as optical band gap, electrical activation energy, melting temperature, hopping conduction, and even thermal conductivity if the proper manufacturing techniques are employed. Of course the implementation of proper manufacturing techniques requires a departure from convention. However, it is just such novel processing technology for producing up to 30% efficient photovoltaic quality amorphous material with optimum synthesized characteristics to which the instant application is directed.

The ultrahigh vacuum deposition and diffusion process of the present invention, due to the contamination controllability which it affords, provides a means of producing photovoltaic quality narrow band gap amorphous alloys. Obviously, the process of the present invention may also be employed to form photovoltaic quality wider band gap amorphous alloys, such as silicon alloys. Moreover, in those instances in which defect states in the energy gap of amorphous silicon alloys are the result of undercoordination, the production techniques described herein can be employed to reduce the density of those defect states. Utilization of the ultrahigh vacuum deposition and diffusion process described herein for passivating defect states is of special importance when silicon is employed as an alloying agent in combination with a narrow band gap material such as germanium which has a tendency to become divalent, or trivalent, or assume other nontetrahedral configurations. Included within the scope of the present invention is the incorporation of the amorphous materials and compensating or density of states reducing elements in discrete layers as the amorphous alloy is deposited onto a substrate so as to provide further control of the electrical, chemical and physical properties of the deposited alloy. Amorphous alloys produced in accordance with the concepts embodied by the present invention result in the fabrication of photovoltaic quality materials characterized by a low density of defect states in the energy gaps thereof, and a high degree of local order.

Silicon is the basis of the huge crystalline semiconductor industry and is the material which has produced expensive high efficiency (18 percent) crystalline solar cells. When crystalline semiconductor technology became commercially viable, it initiated the present semiconductor device manufacturing industry. This was due to the ability of the scientist to grow substantially defect-free germanium and particularly defect-free silicon crystals, and then turn those crystalline materials into extrinsic materials with p-type and n-type conductivity regions therein. This was accomplished by diffusing parts per million of donor (n) or acceptor (p) dopant materials introduced as substitutional impurities into the substantially pure crystalline materials, to increase their electrical conductivity and to control their p or n conduction type.

These crystal growing processes produce such relatively small crystals that solar cells require the assembly of many single crystals to encompass the desired area of only a single solar cell panel. The amount of energy necessary to make a solar cell in this process, the restrictions imposed by the size limitations of the silicon crystal, and the necessity to cut up and assemble such crystalline material have all resulted in an impossible economic barrier to the large scale use of crystalline semiconductor solar cells for energy conversion. Further, crystalline silicon has an indirect optical edge which results in poor light absorption in the material. Because of the poor light absorption crystalline solar cells have to be at least 50 microns thick to acceptably absorb the incident sunlight. Even if the single crystal material is replaced by polycrystalline silicon which can be produced by cheaper production processes, the indirect optical edge is still maintained; hence the material thickness is not reduced. The polycrystalline material also involves the addition of grain boundaries and other defect problems.

In summary, crystal silicon devices (1) have fixed parameters which are not variable as desired, (2) require large amounts of material, (3) are only producible in relatively small areas and (4) are expensive and time consuming to produce. Devices manufactured with amorphous alloys can eliminate these crystalline silicon disadvantages. Amorphous silicon alloys have an optical absorption edge having properties similar to a direct gap semiconductor and only a material thickness of one micron or less is necessary to absorb the same amount of sunlight as the 50 micron thick crystalline silicon. Further, amorphous alloys can be made faster, easier and in larger areas than can crystal silicon alloys, thereby reducing assembly time and cost.

Accordingly, a considerable effort has been made to develop processes for readily depositing amorphous semiconductor alloys or films, each of which can encompass relatively large areas, limited only by the size of the deposition equipment, and which can be readily doped to form p-type and n-type materials where p-n junction devices are to be made therefrom equivalent to those produced by their crystalline counterparts. For many years such work was substantially unproductive. Amorphous silicon or germanium (Group IV) films are normally four-fold coordinated and were found to have microvoids and dangling bonds and other defects which produce a high density of localized states in the energy gap thereof. The presence of a high density of localized states in the energy gap of amorphous semiconductor films results in a low degree of photoconductivity and short carrier lifetime, making such films unsuitable for photoresponsive applications. Additionally, such films cannot be successfully doped or otherwise modified to shift the Fermi level close to the conduction or valence bands, making them unsuitable for making p-n junctions for solar cell and current control device applications.

In an attempt to minimize the aforementioned problems involved with amorphous silicon and germanium, W. E. Spear and P. G. LeComber of Carnegie Laboratory of Physics, University of Dundee, in Dundee, Scotland, did some work on "Substitutional Doping of Amorphous Silicon", as reported in a paper published in *Solid State Communications,* Vol. 17, pp 1193–1196,1975, toward the end of reducing the localized states in the energy gap in amorphous silicon or germanium to make the same approximate more closely intrinsic crystalline silicon or germanium, and of substitutionally doping the amorphous materials with suitable classic dopants, as in doping crystalline materials, to make them extrinsic and of p or n conduction types.

The reduction of the localized states was accomplished by glow discharge deposition of amorphous silicon alloy films wherein a gas of silane ($SiH_4$) was passed through a reaction tube for decomposition by an r.f. glow discharge and deposition onto a substrate at a substrate temperature of about 300°–600° K. (27–327° C.). The material so deposited on the substrate was an intrinsic amorphous material consisting of silicon and hydrogen. To produce a doped amorphous material, a phosphine ($PH_3$) for n-type conduction or diborane ($B_2H_6$) for p-type conduction were premixed with the silane gas and passed through the glow discharge reaction tube under the same operating conditions. The gaseous concentration of the dopants used was between about $5 \times 10^{-6}$ and $10^{-2}$ parts per volume. The material so deposited including supposedly substitutional phosphorus or boron dopant and was shown to be extrinsic and of n or p conduction type.

While it was not known by these researchers, it is now known by the work of others that the hydrogen in the silane combines at an optimum temperature with many of the dangling bonds of the silicon during the glow discharge deposition, to substantially reduce the density of the localized states in the energy gap toward the end of making the amorphous material approximate more nearly the corresponding crystalline material.

D. I. Jones, W. E. Spear, P. G. LeComber, S. Li, and R. Martins also worked on preparing a-Ge:H from $GeH_4$ using similar glow discharge plasma deposition techniques. However, the material obtained gave evidence of a high density of localized states in the energy gap thereof. Although the material could be doped, the efficiency was substantially reduced from that obtainable with a-Si:H. In this work reported in *Philsophical Magazine B,* Vol. 39, p. 147 (1979) the authors conclude that because of the large density of gap states the material obtained is ". . . a less attractive material than a-Si for doping experiments and possible applications."

After developing a successful process for the glow discharge deposition of silicon from silane gas, research was conducted to develop a process for sputter depositing amorphous silicon films in an atmosphere of argon (required by the sputtering deposition process) and molecular hydrogen, to determine the results of such molecular hydrogen on the characteristics of the deposited amorphous silicon film. This research indicated that the molecular hydrogen acted as an altering agent which bonded in such a way as to reduce the localized defect states in the energy gap. However, the reduction of states in the energy gap achieved by the sputter deposition process was much less than that achieved by the silane deposition process described above. The p and n dopant gases (previously detailed with respect to the silane deposition process) also were introduced in the sputtering process to produce p and n doped materials. The resultant materials possessed a lower doping efficiency than the materials produced in the glow discharge process. However, neither the vapor deposition nor the sputtering deposition techniques of depositing amorphous semiconductor layers provided n-doped and p-doped materials with sufficiently high acceptor concentration to produce commercial p-n or p-i-n junction devices. While the n-doping efficiency was below acceptable commercial levels, the p-doping efficiency was particularly unacceptable since the width of the band gap was reduced and the number of localized states in the band gap was increased.

Further research was conducted to additionally reduce defect states in amorphous silicon alloys or in amorphous silicon:hydrogen alloys. Fluorine was found to readily diffuse into and bond to the amorphous silicon, substantially reducing the density of localized states therein, because of its reactivity occasioned by the small size of the fluorine atoms which enables them to be readily introduced into the amorphous silicon matrix. Fluorine was found to bond to the dangling bonds of the silicon in a manner which is more stable and efficient than that is possible when hydrogen is used. However, fluorine introduced into amorphous germanium alloys or amorphous germanium:hydrogen alloys, has not, up to the date of the instant invention, produced an optimized narrow band gap amorphous material.

Numerous attempts have been made to construct both natural and synthetic crystalline analogue materials by special layering techniques with the aim of extending the range of desirable properties which were heretofore limited by the availability of natural crystalline materials. One such attempt involved compositional modulation by molecular beam epitaxy (MBE) deposition on single crystal substrates. Esaki, Ludeke and Tsu, in U.S. Pat. No. 3,626,257, describe the fabrication of monolayer semiconductors by one MBE technique. These modulated prior art structures are typically called "superlattices". Superlattice fabrication techniques are based on the concept that layers of materials may be made to form a one-dimensional periodic potential by periodic variation of (1) alloy composition or (2) impurity density. Typically, the largest period in these superlattices is on the order of a few hundred Angstroms, however, monatomic layered superlattice structures have also been constructed. The superlattices can be characterized by the format of (1) several layers of a material "A" (such as GaAs), followed by (2) several layers of a material "B" (such as AlAs), in a repetitive manner, (3) formed on a single crystal substrate. The optimum superlattice is a single crystal synthetic material with good crystalline quality and electron mean free paths greater than the period. Conventional superlattice concepts have been utilized for special electronic and optical effects. The most severe limitation on good quality superlattice fabrication is that the lattice constants must be very carefully matched, thereby limiting the utilization of these superlattices.

In related work, Dingle, et al., see U.S. Pat. No. 4,261,771, disclose quasi-superlattices and non-superlattice structures. The former are comprised of epitaxially grown crystalline islands of a foreign material in an otherwise homogeneous layered background material. The latter, non-superlattice structures, are an extension of quasi-superlattice materials in that the islands are grown into columns which extend vertically through the homogeneous layered background material.

In addition to MBE superlattice construction techniques, other researchers have developed layered synthetic microstructures which utilize different forms of vapor deposition, including diode sputtering, magnetron sputtering, and standard multisource evaporation and organo-metallic vapor deposition.

The layer dimensions of these synthetically produced materials may be controlled by (1) shutters, (2) moving the substrates relative to the sources of material, (3) control of the partial pressure of the reactive gases, or (4) combinations of shutters and substrate movement. The resultant materials have been formed from crystalline layers, noncrystalline layers and mixtures thereof. However, each of the research efforts so far reported has attempted to synthesize superlattice-type structures by precisely reproducing the deposition conditions on a periodically reoccuring basis. These materials can be thought of as synthetic crystals or crystal analogues in which the long range periodicity, the repetition of a particular combination of layers, or the grading of layer spacing must be closely maintained. Consequently, superlattice structures, so constructed, are both structurally and chemically homogeneous in the x-y plane, but periodic in the z direction.

In addition to the synthetic material-producing techniques described above, compositionally varied materials and processes for their production are disclosed in copending U.S. patent application Ser. No. 422,155, filed Sept. 23, 1982, entitled Compositionally Varied Materials And Method For Synthesizing The Materials, by Stanford R. Ovshinsky, assigned to the assignee of the instant application and which is incorporated herein by reference.

Other methods of producing amorphous alloy materials, specially adapted for photovoltaic applications, are disclosed in Assignee's U.S. Pat. Nos. 4,217,374; 4,226,898 and 4,342,004. The deposition techniques described therein are adapted to produce alloy materials including germanium, tin, fluorine and hydrogen as well as silicon. The alloy materials are produced by vapor and plasma activated deposition processes. Further, (1) amorphous cascade type multiple cell devices are disclosed in copending U.S. patent application Ser. No. 427,757, entitled Multiple Cell Photoresponsive Amorphous Alloys and Devices, and (2) amorphous germanium alloys are disclosed in copending U.S. patent application Ser. No. 427,754, entitled Method Of Making Photoresponsive Amorphous Germanium Alloys And Devices.

Of special significance relative to the concepts embodied in the present application is copending U.S. patent application Ser. No. 514,688 of Stanford R. Ovshinsky filed July 18, 1983 entitled Enhanced Narrow Band Gap Alloys For Photovoltaic Applications, and also assigned to the assignee of the instant applications (hereinafter referred to as "said previous patent application").

Said previous patent application identified the failure of fluorine and hydrogen to compensate for the dangling bonds of narrow band gap amorphous materials as being directly associated with the tendency of narrow band gap amorphous materials, such as germanium, to become divalent or assume other nontetrahedral configurations. Said previous patent application proposed to solve the problem by causing the amorphous narrow band gap materials to bond in a more tetrahedral configuration. More particularly, that invention proposed to minimize or eliminate the tendency of such narrow band gap amorphous materials to assume divalent, distorted tetrahedral, or other nontetrahedral coordination.

Said previous patent application sought to solve the problem of nontetrahedral bonding by promoting or activating the inert pair of valence electrons so as to expand the coordination thereof, which permits their use in bonding with compensating elements. As the coordination of the inert pair of valence electrons was expanded, the production of low band gap materials having the prerequisite low density of defect states was made possible.

The procedure prescribed in said previous patent application included the following steps. First the competing reactions which interfered with or prohibited the activation of the inert pair of valence electrons were eliminated. Second, a density of states reducing element(s) such as hydrogen and/or fluorine was provided in a form which would compensate the low band gap amorphous alloys. If hydrogen, for example, was selected as the density of states reducing element, it would be admixed with the amorphous material in atomic form. Molecular hydrogen was described as not being able to expand the coordination of amorphous materials such as germanium. If fluorine was selected as the density of states reducing element, it would also be provided in free radical form for enhancing formation of the amorphous alloy. Fluorine was noted to be "the super halogen" (the most electronegative element) when supplied in free radical form, and was described as capable of promoting or activating the inert pair of valence electrons by expanding the orbitals, thereby achieving tetrahedral configuration. Fluorine further (1) eliminates dangling bonds, (2) provides ionicity to the bonding to help relieve stresses in the alloyed materials, and (3) acts as a bridging or crosslinking structural element in the expanded structural configurations.

The third necessary step of the procedure described in said previous patent application was to provide external excitation of the density of states reducing element so as to promote the proper tetrahedral bonding. The amorphous material could also be externally excitable so that the energy of the inert pairs of valence electrons thereof are raised, thereby increasing their reactivity. Alternatively or concomitantly, the energy of the substrate and the amorphous alloy being deposited thereon can be raised to the activation level necessary for promoting the orbitals and exciting the electrons to ultimately increase the reactivity of the inert pair of valence electrons.

Said previous patent application described an enhanced narrow band gap amorphous semiconductor alloy and the method for producing same. More particularly, said previous patent application provided a general discourse of and background information for the specific concepts detailed and expanded upon herein. However, the process described therein was primarily directed to codeposition of free radicals of the amorphous material and free radicals of the density of states reducing element in a contaminant-free environment so as to achieve tetrahedral coordination therebetween. The codeposition did not take into account the fact that the resultant amorphous alloy is a heterogeneous material made up of two series of regions, as fully explained hereinafter, which must be individually treated in order to reduce the density of defect states to the lowest possible levels. In contradistinction thereto, the present application is directed to a novel post deposition diffusion process in which unadulterated amorphous material is deposited onto a substrate at a low substrate temperature before the, preferably activated, density of states reducing element is introduced into the ultrahigh vacuum environment. Since (1) an environment is provided in which there are no contaminants present to occupy the available bonding sites of the amorphous material, and (2) the deposition occurs at a low temperature, the deposited amorphous material is a porous mass of voids, vacancies, dangling bonds, etc. Therefore, the density of states reducing element readily diffuses into and is greedily accepted by the reactive amorphous material to reduce the density of defect states in those regions of the heterogeneous amorphous alloy characterized by a relatively low density of defect states. An annealing step completes diffusion of the density of states reducing element through the amorphous material for reducing the density of defect states in those regions of the heterogeneous amorphous alloy characterized by a relatively high density of defect states. In this manner the present invention deals with the heterogeneous nature of the amorphous alloy as never contemplated in prior art methodology. Finally, a strain relieving element may be introduced to relax bonding stresses in the resultant alloy and ion implantation may be employed to reduce the density of defect states in regions of the amorphous alloy which are unaccessible to the diffusion process.

In order to explain the manner in which the basic concepts employed by the present invention solve the problem of forming a photovoltaic quality, tetrahedrally coordinated amorphous material, reference is now made to FIGS. 1-4 of the drawings. FIG. 1 depicts in highly stylized schematic form, an enlarged portion of unadultered amorphous material 9 which was deposited at relatively high (180° to 300° C.) temperature. The enlarged portion of amorphous material 9 is characterized by (1) a continuous random network region 13 characterized by a relatively low density of defect states, hereinafter referred to as a "low defect region", and (2) a region 15 characterized by a relatively high density of defect states, hereinafter referred to as a "high defect region".

As described hereinabove, in a perfect crystalline solid each atom has all of its available bonding sites filled so that the matrix of atoms so formed is at its lowest possible energy level. In contrast thereto, in an amorphous solid the atoms are randomly ordered, i.e., there is no repetitive long range periodic order or pattern of atoms. It therefore becomes very difficult, if not impossible, to satisfy all valency requirements of amorphous solids, since to do so would require bending, stretching, and/or twisting of its chemical bonds. Accordingly, amorphous solids possess a finite number of defect states such as missing, broken, stretched, twisted or highly strained chemical bonds.

It must both be noted herewith and strongly emphasized that the depictions of the low and high defect regions in FIGS. 1, described hereinabove, and in FIGS. 2-4, described hereinafter, are highly stylistic so as to better facilitate the description and understanding of the principles of the instant invention. In actuality, the low defect regions 13 and the high defect regions 15, rather than being of homogeneous size, shape, location and distribution as shown in the figures, are of highly irregular, non-homogeneous size, shape, location and distribution. Specifically, the low defect regions are, in reality, irregularly shaped clusters separated by irregularly spaced, irregularly shaped neighboring clusters. Therefore the accompanying figures are not pictorial illustrations but, rather, are diagrammatic representations intended to symbolically depict the size, shape, proximity of nearest neighbors and geometric distribution of the two series of regions.

Keeping this provision in mind and again referring to FIG. 1, because of the relatively large number of defects such as dangling bonds, trap sites and spin defects, which are present in the high defect regions 15, the amorphous material is in an activated state wherein it greedily awaits the introduction of a passivating agent (a defect state reducing element) such as hydrogen, fluorine, oxygen and the like to complete its coordination and relieve internal bonding stresses. In contradistinction thereto, the amorphous material in the low defect regions 13, has a relatively small number of defects, such as dangling bonds, etc., and is consequently relatively unreactive with and impermeable to said passivating agents. Obviously, the higher the energy level of the valence electrons of the unfilled orbitals of the amorphous material and the valence electrons of the passivating agent, the greater the likelihood of chemical combination therebetween. It is the object of the present invention to entirely diffuse the density of states reducing element into and through both the low defect regions and the high defect regions which combine to form the heterogeneous amorphous alloy. Because the amorphous material is indeed heterogeneous, different techniques must be employed to diffuse a passivating element into the interior confines of that host material. To illustrate the difficulties of diffusing atoms of the passivating element into the interior of the material, note that even the low defect regions contain dangling bonds, electron trap sites, spin defects, etc., said defects in the low defect regions will hereinafter be referred to as "low defect region defects" and stylistically represented by the reference numeral 17. As with the representations of the high defect regions 15 and the low defect regions 13, the low defect region defects 17 are actually of highly irregular shapes, sizes and geometrical distributions. The four, five or six X's depicted in the drawings as symbolizing these low defect region defects 17 are intended to be merely symbolic of the fact that the low defect regions 13, themselves, are not perfectly coordinated.

If the amorphous material 9 was a perfectly arranged cluster of tetrahedrally coordinated atoms, the density of states reducing element would have absolutely no difficulty in diffusing into and through the entire body thereof. However, because even the low defect regions 13 contain defects 17, there are no clearly defined, unobstructed passageways which atoms of the density of states reducing element can follow to passivate dangling bonds, etc. which exist centrally of the body of amorphous material 9. It should be obvious, however, that the atoms of the density of states reducing element can most easily traverse the tortuous path of travel through the low defect regions 13 before reaching and being blocked by the tangled mass of defects that exist in the high defect regions 17.

From the foregoing description, it should be apparent that, in contradistinction to prior art techniques for passivating defect states in the band gap of amorphous materials which treated the amorphous material as being homogeneous, the method proposed herein for reducing those defect states accepts the amorphous material as a heterogeneous body and treats the defect states in the different series of regions, i.e., the series of high defect regions 15 and the series of low defect regions 13, individually. The result is a two pronged process which includes a low temperature diffusion step to passivate states 17 in the low defect regions 13 and and annealing step to passivate states in high defect regions 15, whereby the two pronged process achieves a clear reduction of defect states in the band gap of that amorphous material.

Turning now to FIG. 2, a stylized depiction of an unadulterated, relatively porous, void and vacancy-filled amorphous solid 9' deposited at a relatively low temperature (−20° to 180° C.) is schematically illustrated. As with the amorphous solid 9 shown in FIG. 1, this amorphous solid 9' also includes a series of low defect regions 13' having defect states 17' therein and a series of high defect regions 15'. Comparing the two series of regions which combine to form the heterogeneous network of atoms of amorphous material 9 shown in FIG. 1 with the two series of regions shown in FIG. 2, the morphological differences therebetween are immediately apparent. In FIG. 1 the low defect regions 13 are bounded by relatively narrow high defect regions 15; or, in other words, the low defect regions 13 are situated in close proximity to nearest neighbor clusters of low defect regions 13. In FIG. 2, the low defect regions 13' are bounded by relatively wide high defect regions 15'; or, in other words, the nearest neighbor clusters of low defect regions 13' are not in as close proximity to one another. The foregoing discussion is meant to illustrate the relative ease or difficulty atoms of the density of states reducing element, such as hydrogen or fluorine, would have in diffusing through the continuous random network of high and low defect regions to ultimately diffuse completely into and combine with most of the interior atoms of the amorphous material. Specifically, in the amorphous material 9 of FIG. 1, the relatively narrow high defect regions 15 make it relatively difficult for a fluorine or hydrogen atom to diffuse into and passivate defects located interiorly of the periphery of the material. In contradistinction thereto, the amorphous material 9' shown in FIG. 2 may be readily passivated by fluorine or hydrogen atoms since the relatively wide high defect regions 15' allow for the atoms to diffuse into and combine with the interiorly disposed electrons in the unfilled orbitals of the amorphous material. It should therefore be readily apparent the defect states in amorphous materials prepared using low temperature deposition processes, being porous, void-filled masses, may be more easily passivated than those in the dense material produced using a high temperature deposition process. Of course, the amorphous material 9', itself, contains more high defect regions 15', but those regions can be passivated by the density of states reducing element to achieve better material than can be deposited by the high temperature process, but which cannot be effectively passivated.

FIG. 3 is yet another diagrammatic representation, albeit a more realistic representation of an amorphous solid 9" produced in a low temperature deposition process. The amorphous material 9" includes the series of low defect regions 13" and the series of high defect regions 15" which combine to form the heterogenous network of atoms, as previously described. However, the relative disposition of these regions to their nearest neighbor more candidly depicts the real world. More specifically, the spacing between low defect regions 13" is generally irregular, following no set pattern. Likewise, in reality, the high defect regions 15" vary in size, location, geometric distribution and shape. For example, some high defect regions such as 15a" and 15b" are relatively wide, with nearest low defect region neighbors 15" being spaced a relatively great distance therefrom. On the other hand, other high defect regions such as 15c" and 15d" are relatively narrow, actually approximating regions resulting from the high temperature deposition process of FIG. 1, and having nearest low defect region neighbors 15" being spaced a relatively small distance therefrom. Still other defect regions such as 15c" are relatively wide, but are effectively "walled off" and held relatively incommunicado from the infusing density of states reducing elements by the contiguous relatively narrow high defect regions 15". The diffusion of density of states reducing elements, such as fluorine and hydrogen, through the amorphous material 9" to passivate defect states in the high defect regions 15", thereof will proceed (1) through the low defect regions 13" (passivating defect states 17" therein), and then (2) in those readily accessible and relatively wide, high defect regions such as 15a" and 15b". However, in those high defect regions 15" which are relatively narrow, such as 15d" and 15c", or those regions which are relatively inaccessible, such as 15e", passivation will be more difficult since permeablity of the fluorine or hydrogen atoms is prohibited by the narrow high defect regions.

One possible solution to the problem of passivating the relatively inaccessible high defect regions (regions even inaccessible after annealing) is addressed in FIG. 4, which is again a schematic representation, substantially identical to the representation of the series of defect regions illustrated in FIG. 3. According to this solution, a passivating agent, such as fluorine or hydrogen, may be energetically directed through the amorphous solid 9" from a source such as an ion implantation gun 21. Rather than relying upon diffusion which can be blocked by the narrow high defect regions, such as 15c" and 15d," energetic fluorine or hydrogen ions are implanted into the inaccessible high defect regions 15", of the amorphous material 9", thereby reducing the density of defect states interiorly thereof. Obviously, the relatively inaccessible high defect regions can also be passivated by other techniques such as ultrasonic agitation.

In summary, prior to the instant application, with the exception of said previous patent application, efforts have been made to provide synthesized amorphous alloy materials having specific desirable properties. The resultant materials have, in some cases, been provided with desirable chemical, electrical and optical characteristics when employed in tandem or single cell photovoltaic and similar semiconductor devices. However, no process has treated amorphous material as heterogeneous nor been able to fabricate a narrow band gap alloy material which has optimum chemical, electrical and optical properties for utilization as the bottom cell in a multiple cell photovoltaic device which makes use of low temperature evaporation methodology. The amorphous germanium alloys which have been reported to date (with the exception of said previous patent application) possess unacceptable levels of defect states in the band gaps thereof so that the actual technology required to produce 30% cell efficiency is still lacking. The previously described conventional methods of producing amorphous alloys by glow discharge plasma deposition, sputtering, evaporation, etc. have as yet to even optimize the removal of defect states in amorphous silicon alloys, and have not produced photovoltaic quality amorphous germanium alloys. In contradistinction to the foregoing techniques and processes for the fabrication of amorphous alloys possessing narrow band gaps in particular, and amorphous alloys regardless of band gap width in general, the invention described herein is specifically directed to a method employing (1) low temperature diffusion for passivating the defect states in the low defect regions of all amorphous alloys, and (2) an annealing step for passivating the defect states in high defect regions so as to provide amorphous semiconductor alloys capable of achieving 30% efficiency when used in photovoltaic devices.

BRIEF SUMMARY OF THE INVENTION

There is disclosed herein a method of fabricating a tetrahedrally coordinated, photovoltaic quality amorphous alloy characterized by a reduced density of defect states in the band gap thereof. The method includes at least the steps of (1) forming unadulterated, relatively porous amorphous material at a temperature selected to optimize the reactivity thereof, so that the amorphous material is adapted to facilitate the chemical combination thereof with any available reactant; (2) maintaining an ultrahigh vacuum environment of less than $10^{-8}$ torr so that said environment is substantially free of all elemental reactants and other contaminants capable of competing for use of the valence electrons of said amorphous material; (3) introducing at least one density of states reducing element into the ultrahigh vacuum environment such that the at least one density of states reducing element is the only material present for chemical combination with the available valence electrons of the reactive amorphous material; (4) diffusing the at least one density of states reducing element into the reactive amorphous material for passivating the defect states in the band gap of the amorphous material; and (5) annealing the amorphous alloy to complete diffusion of the at least one density of states reducing element, whereby a dense photovoltaic quality amorphous alloy having a low density of defect states is formed. The amorphous material is to be selected from the group of precursor materials which consists essentially of silane, silicon, silicon and a dopant, germane germanium, germanium and a dopant, and combinations thereof. The density of states reducing element is selected from the group of elements which consists essentially of fluorine, hydrogen, oxygen, chlorine and combinations thereof. In the preferred embodiment, the amorphous material is evaporated onto a substrate prior to introducing the density of states reducing element into the ultrahigh vacuum environment. The amorphous material, being substantially unadulterated and uninfluenced by contaminants, is very reactive and greedily awaits the diffusion of the density of states reducing element thereinto. As the resultant amorphous alloy is formed, surface excitation may be supplied to aid diffusion, ion implantation may be utilized to reduce states in relatively inaccessible regions of the amorphous matrix, and a strain reducing element may be introduced to relax bonding stresses in the amorphous alloy.

The improved, tetrahedrally coordinated photovoltaic quality amorphous alloy formed in the foregoing manner from the amorphous material and the density of states reducing element is also disclosed and claimed in product-by-process form. Finally, described herein, also in product-by-process form, is an improved amorphous multiple-cell photovoltaic device comprising at least two serially deposited photovoltaic cells, at least one of the cells being formed from the amorphous material with the density of states reducing element diffused thereinto, as previously described.

By the foregoing techniques, Applicants have effected chemical reactivity in which a sufficient supply of, in the preferred embodiment, an atomic density of states reducing element is diffused into a very reactive amorphous material on an excited substrate surface so as to form an amorphous alloy which is coordinated in the lowest free energy configuration. The amorphous alloy may require relaxation since all of its bonding sites are now occupied. This can be accomplished by the post deposition introduction of a strain reducing element. In this manner wide and narrow band gap materials, capable of being used in and producing a 30% photovoltaic cell, can be produced.

BRIEF DESCRIPTION OF THE DRAWINGS

FIG. 3 is a greatly magnified partial plan view of the amorphous material deposited at low temperature, and showing a more realistic arrangement of the continuous random network of atoms;

FIG. 4 is a greatly magnified partial plan view of the amorphous material illustrated in FIG. 3 and schematically depicting the use of ion implantation to reduce defect states;

FIG. 9 is a graph of dark conductivity versus annealing temperature for an amorphous silicon alloy depicting the difference between diffusion with a density of states reducing element with and with pre-annealing.

DESCRIPTION OF THE PREFERRED EMBODIMENT

Previous attempts to produce amorphous narrow band gap alloys of photovoltaic quality have not been successful and previously produced amorphous wider band gap alloys have not been optimized. As previously stated, this is because a process has yet to be invented which accepts the heterogeneity of amorphous materials and employs that characteristic to (1) remove sufficient contamination to reduce defect states in the band gaps of those amorphous alloys and (2) combine the amorphous material and the density of states reducing element in such a manner that said alloys can assume true tetrahedrally bonded configurations. The previously produced amorphous alloys, not being tetrahedrally bonded, contained both spin and spinless defects which resulted from distorted, non-tetrahedral bonding configurations. These are referred to as "silent defects" since they are undetectable by conventional electron spin resonance measurements.

Therefore, said previously produced amorphous alloys, while claiming to have a small number of spin defects based upon a misplaced reliance on electron spin resonance measurements, actually might possess a high number of silent defects and hence not be of photovoltaic quality. These defects are not as prevalent in wider band gap amorphous alloys as in narrow band gap amorphous alloys, since wider band gap material such as silicon have has a tendency to form the necessary $sp^3$ hybrid orbitals and become tetrahedrally coordinated. It cannot be too greatly emphasized that previously produced amorphous alloys exhibiting the highest efficiencies haved possessed the most tetrahedral coordination. It can therefore be seen that it is necessary to produce the amorphous materials in a manner which will best effectuate tetrahedral bonding in order to fabricate optimized photovoltaic quality material.

Finally, note that under extreme circumstances, fluorine can chemically react with Group IV materials to produce sixfold coordination by hybridization with the d orbital electrons without producing defect states. This extreme tendency for sixfold coordination enhances the probability that all bonds are saturated, thereby making the elimination of defects and generation of new chemical configurations more likely. While fluorine is important in reducing the density of defect states in amorphous silicon alloys, fluorine is essential when forming alloys with the lesser tetrahedrally coordinated amorphous elements such as germanium. As used herein, the term "substantially tetrahedrally coordinated" refers to a predominantly tetrahedral bonding configuration, regardless of the presence of some higher or lower order coordinations which normally do not produce defect states.

Figure 5:
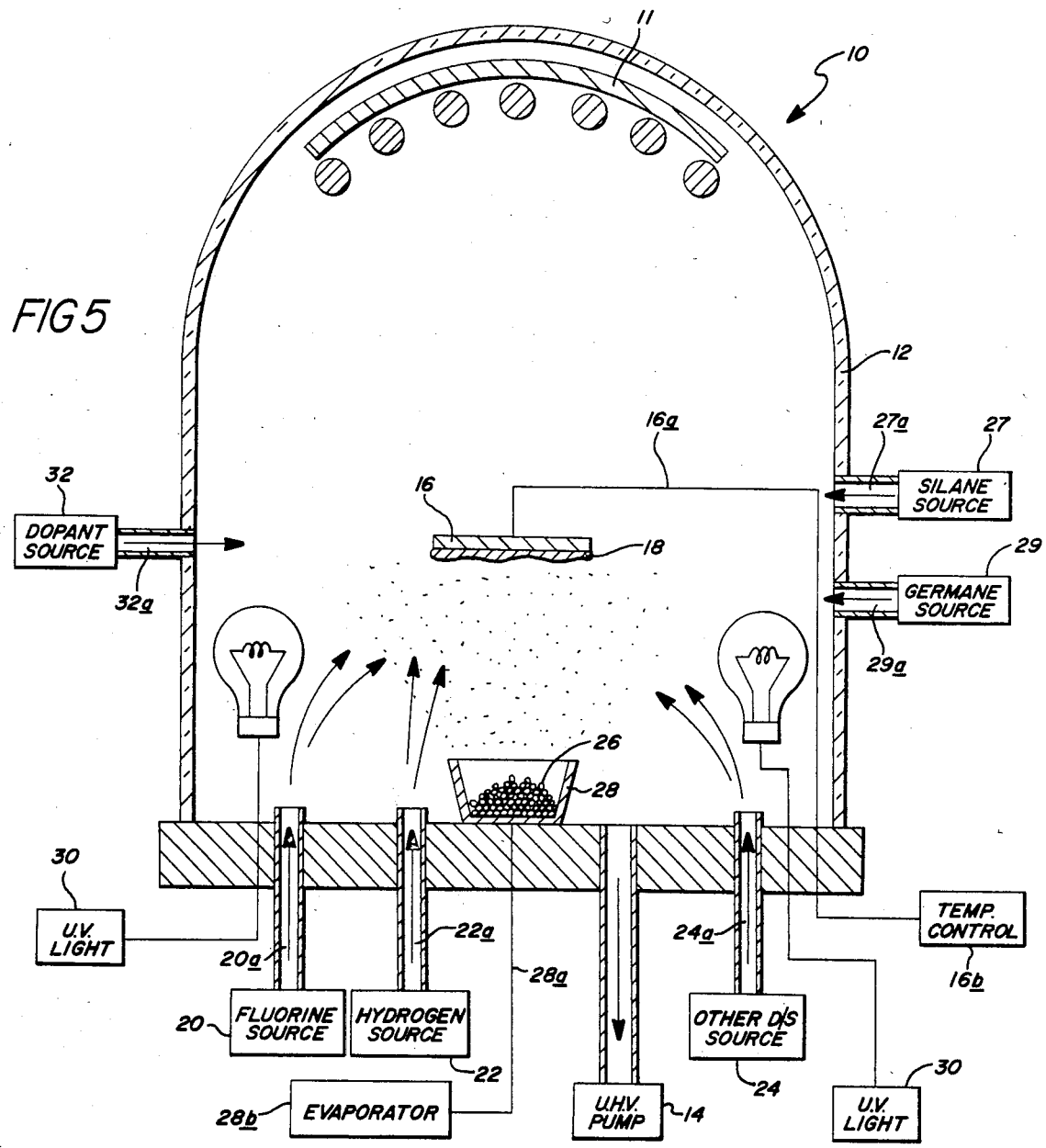
FIG. 5 is a diagrammatic cross-sectional view of vacuum deposition apparatus adapted to deposit photovoltaic quality amorphous alloys.

Referring now to FIG. 5, vacuum deposition apparatus is illustrated generally by the reference numeral 10, said deposition apparatus 10 including an ultrahigh vacuum deposition chamber 12 preferably maintained at a pressure of approximately $10^{-8}$ to $10^{-11}$ torr by at least one ultrahigh vacuum pump 14 which is adapted to provide and maintain a substantially contaminant-free environment in which the deposition of photovoltaic quality amorphous alloys can occur. Disposed within the deposition chamber 12 is a substrate 16 which is connected via line 16a to a temperature control 16b adapted to maintain the substrate temperature and hence the temperature of the amorphous alloy 18 deposited thereupon at a preselected level. Also disposed in the deposition chamber 12 is a bank of temperature controllers 11, such as heaters or coolers, for warming or cooling the chamber 12 to a desired temperature before beginning the deposition procedure. The deposition chamber 12 is coupled to a source of a density of states reducing element such as: fluorine 20, in either molecular or atomic form, by an introduction conduit 20a; hydrogen 22, in either molecular or atomic form, by an introduction conduit 22a; and other density of states reducing elements 24, either in molecular or atomic form, by an introduction conduit 24a. In the preferred embodiment, crystals 26 of a precursor amorphous-forming material such as crystalline silicon or crystalline germanium are operatively placed within a crucible 28 disposed within the ultrahigh vacuum environment of the deposition chamber 12. Operatively coupled to the crucible 28 by power line 28a is an evaporator (such as a heater) 28b for evaporating the precursor crystals 26 into the ultrahigh vacuum environment. In another preferred embodiment, a source of silane 27 or germane 29 is coupled to the deposition chamber 12 via introduction conduit 27a or 29a, respectively, for introducing these amorphous precursor materials into the ultrahigh vacuum environment. In the preferred embodiment, after the amorphous-forming precursor material 26 is vaporized into the ultrahigh vacuum environment, one or more of the density of states reducing elements from sources 20, 22 or 24 are introduced into the environment. The amorphous material 18, deposited onto the surface of the substrate 16, being in a highly reactive state, eagerly awaits the density of states reducing element so that said density of states reducing element can bond with the valence electrons in its unfilled orbitals.

In operation, the deposition chamber 10 is first preheated by the temperature controllers 11 to begin the contaminantion elimination process, and then is pumped down to, in the preferred embodiment, a pressure below $10^{-10}$ torr by the ultrahigh vacuum pump 14 so as to remove virtually all remaining contaminants. The temperature control 16b is set to provide the desired deposition temperature of the substrate 16, and either (1) the evaporator 28b is energized to begin vaporizing the amorphous material-forming precursor crystals 26 from the crucible 28, or (2) the precursor germane gas from the source 29 or silane gas from the source 27 is introduced into the environment. After the amorphous material 18 has been deposited onto the surface of the substrate 16, the density of states reducing element(s) from one or more of the sources 20, 22 or 24 are introduced into the ultrahigh vacuum environment within the deposition chamber 12. The conduits 20a, 22a and 24a, through which the density of states reducing elements are introduced into the deposition chamber 12, are so operatively coupled to the chamber 12 and spaced relative to the substrate 16, that the evaporated amorphous precursor materials and the density of states reducing elements remain in agitated states as they (1) meet and (2) the density of states reducing element begins to diffuse through the unadulterated amorphous material 18 which is deposited onto the surface of the substrate 16. As used herein, "unadulterated" is defined as substantially pure amorphous material with which no contaminating elements or compounds have combined, and the dangling bonds and unfilled orbitals of which are therefore eagerly awaiting combination with a density of states reducing element. Note that in the case where silane or germane is employed as a precursor material, hydrogen is already diffused throughout the amorphous alloy. The annealing step in the presence of additional activated hydrogen then completes the diffusion process. Finally, a set of ultraviolet lights 30 are provided for delivering surface excitation to the amorphous alloy 18 deposited on the substrate 16, and a hydrogen implantation gun (not shown) is employed to reach the relatively inaccessible defect states, described hereinabove.

Tetrahedral coordination of the deposited amorphous alloy is thereby provided, however, the amorphous alloy, having its four available bonding sites occupied by the density of states reducing element, may be too highly stressed, i.e., it may be very rigid and inflexible with a high degree of strain. At this point, if it is necessary, a strain relieving element such as hydrogen may be introduced into the deposition chamber 12 and diffused into the deposited amorphous alloy 18 to relax the bonding stresses in said alloy.

The sources 20, 22 and 24 of density of states reducing elements are adapted to provide the elements in an excited state, without contaminants, for combining with the amorphous material 18 on the surface of the substrate 16 as a tetrahedrally coordinated amorphous alloy having a low density of defect states. The super halogenicity of fluorine makes it the most efficient promoter of tetrahedral coordination in the absence of contaminants which can compete for the available bonding sites of the host amorphous material. As previously stated, in the preferred embodiment of the invention, the excited density of states reducing element(s) is introduced into the deposition chamber 12 at such a distance from the substrate 16 that diffusion of the element(s) into the amorphous material deposited on the substrate 16 to form the amorphous alloy occurs prior to relaxation of the density of states reducing element(s). It is readily apparent that the atomic form of the density of states reducing element(s) is more effective than the molecular form thereof in reducing defect states in the absence of competing contaminants, thereby promoting tetrahedral coordination, especially when the vaporized amorphous precursor material 26 is also excited to free radical form. It is also to be stressed that fluorine represents the preferred choice of density of states reducing element, especially when germanium is utilized as the amorphous material. This, however, does not mean that other elements cannot be used to promote tetrahedral bonding and reduce defect states. For instance, hydrogen, chlorine or oxygen may be employed to reduce defect states if they are combined in the manner taught by the instant invention.

The diffusion of the density of states reducing element into the matrix of the amorphous material so as to eliminate dangling bands and other defect states following the deposition of the amorphous material onto the substrate 16 can be aided by providing sufficient energy to promote tetrahedral coordination. The excitational energy, which has previously been described as a source of ultaviolet light 30, can also take the form of a laser, microwave generator, radio frequency generator, electron beam gun, X-ray beam generator, or an ultrasonic source. Regardless of its form, the excitation can be utilized to agitate the amorphous material and the density of states reducing element to the energy level required for tetrahedral bonding. The excited constituents in the ultrahigh vacuum environment, not having to compete with contaminants, are able to form proper bonding configurations in both the gaseous and alloy phase. An annealing process can then be utilized to complete diffusion of the density of states reducing element through the amorphous material to reduce the density of defect states by mating with dangling bonds and filling orbitals throughout the deposited material.

As an example of the importance of a contaminant free environment, note that a tetrahedrally coordinated material will readily incorporate certain contaminating elements if those elements are present in the deposition environment. If oxygen is incorporated to form totally divalent bonds, the defects need not be seriously detrimental. However, if oxygen is incorporated in a nonbridging manner, then it can introduce localized defect states in the band gap, thereby deleteriously affecting the properties of the amorphous alloy. Due to its threefold coordination, nitrogen is even more likely than oxygen to introduce defects in the amorphous alloy into which it is incorporated. Carbon has multi-bonding possibilities and is therefore capable of introducing defects, especially as its percentage in the alloy is increased. Water moisture is harmful because resulting OH radicals provide weak hydrogen bonding which can lead to metastable defect states. Therefore, reducing the contamination which impurities such as oxygen, nitrogen, carbon and water vapor cause, enables hydrogen and fluorine and other defect reducing elements to eliminate dangling bonds, and other defect states for optimizing tetrahedral configurations in hybrid $sp^3$ orbitals.

In order to provide the doped layers of the amorphous alloy which are necessary to fabricate a multicelled photovoltaic device, one or more dopant sources 32 are operatively coupled, via a dopant introduction conduit 32a, so as to introduce dopant material into the deposition chamber 12. Preferably, a separate source 32 is provided to introduce each dopant material into an individual deposition chamber such as 12 (except for those instances in which a plurality of dopant materials are to be deposited in the same layer), however, for the sake of simplicity only a single source is shown in FIG. 5. More particularly, boron is conventionally utilized as a p type dopant and phosphorous is utilized as an n type dopant. While small amounts of boron or phosphorous thus serve a useful purpose, large amounts can cause defect states and are thus, for the purposes of this application, considered contaminants. However, to eliminate the possibility of having boron cause additional defects, a second p type dopant such as aluminum can be utilized. Further, to insure that the dopants are properly admixed with the amorphous material, they are excited by one or more of the sources 30, as explained supra. It is essential that the precursor material be unadulterated, i.e., be contaminant-free and ultrapure to further prevent impurities such as oxygen, nitrogen, carbon and water vapor from competing with the density of states reducing materials for occupation of the available bonding sites of the amorphous material.

Figure 1:
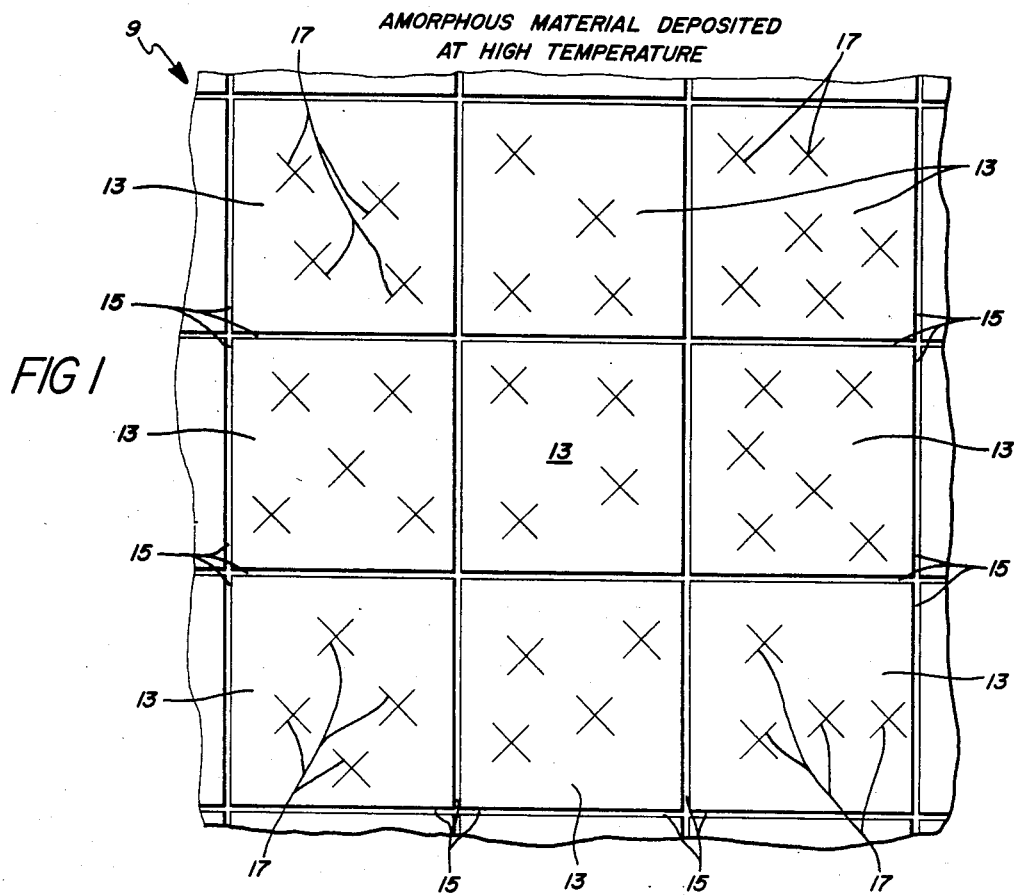
FIG. 1 is a greatly magnified partial plan view of an amorphous material formed by a high temperature deposition process and illustrating schematically the relatively narrow diffusion passageway provided by the high defect regions of the continuous random network of atoms.
Figure 2:
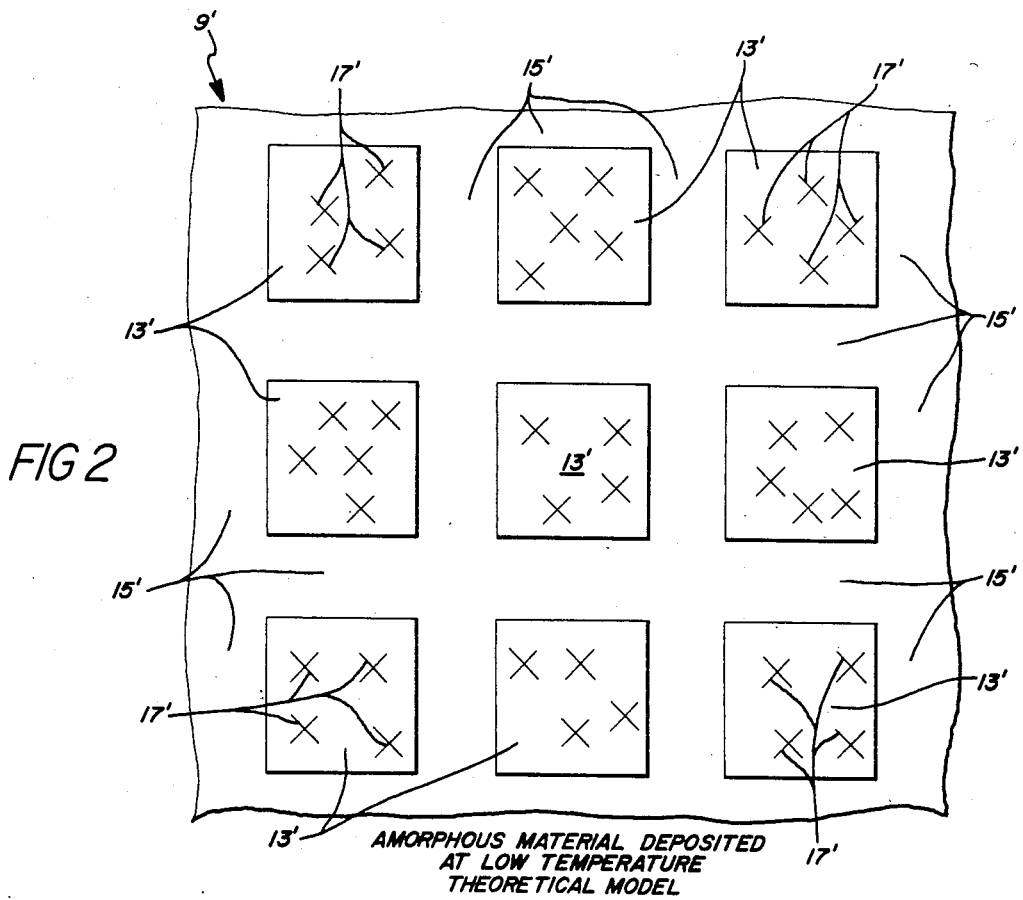
FIG. 2 is a greatly magnified partial plan view of an amorphous material formed by a low temperature deposition process and schematically illustrating the relatively wide diffusion passageway provided by said high defect region of the continuous random network of atoms.
Figure 6:
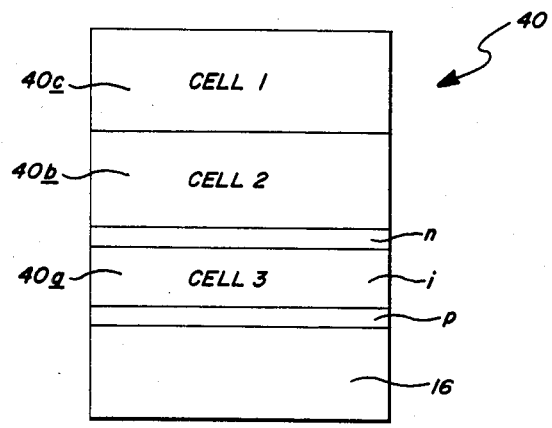
FIG. 6 is a diagrammatic representation of a multiple-cell photovoltaic device including amorphous alloys fabricated by concepts and processes disclosed in the present application.

The amorphous alloy 18 is most preferably utilized in the multiple-cell type photovoltaic device 40 illustrated in FIG. 6. The multiple cell device 40 includes a substrate 16 upon which at least two, and preferably three, cells 40a, 40b and 40c are serially deposited. The top cell 40c is generally formed of an amorphous silicon alloy having a band gap of 1.7 to 1.9 eV, as described by U.S. Pat. Nos. 4,217,374 and 4,226,898. The second or intermediate cell 40b is generally formed of an amorphous silicon-germanium alloy, having a band gap of 1.4 to 1.7 eV, as described by U.S. Pat. No. 4,342,044. The third cell 40a is formed of an amorphous germanium alloy having a band gap of 0.8 to 1.3 eV (preferably about 1.1 eV) as described herein.

Each of the cells of the photovoltaic device 40 are preferably formed of a p-i-n configuration and are matched so the currents generated in each cell are substantially equal. In this manner, light is directed serially through each of the cells, resulting in the voltage generated by the device being equal to the sum of the voltage generated by each individual cell. The cell 40a is shown formed by a p doped layer, an intrinsic (i) layer, and an n doped layer; however n-i-p cells also can be utilized. Obviously, one or more band gap adjusting elements, such as carbon or nitrogen, can be utilized to increase the band gap of the cells as desired. In addition to its aforementioned properties, fluorine permits the use of carbon and nitrogen to increase the band gap, if the adjusting elements are carefully incorporated as alloying elements rather than as impuritiy elements, such as by the excitation techniques described herein above.

It should finally be noted that according to principles embodied herein, other elements which enhance tetrahedral coordination over divalent coordination may be added to the amorphous material and/or density of states reducing element in trace amounts. These elements which are defined herein (without limiting their other possible beneficial properties) as "tetrahedral coordination enhancers", not only can increase tetrahedral structure, but can (1) act as chemical compensators and (2) fill spaces to force tetrahedralness. This is accomplished due to (1) the size of the atoms introduced into the host matrix, (2) the charge of the atoms introduced into the host matrix, and (3) filling all four bonding positions (for example, a divalent atom attaching itself to the divalency of germanium). The elements may be introduced into the alloys in any percentage desired in accordance with the techniques described in U.S. Pat. No. 4,342,044.

Now that (1) the theory as to why the process embodied by the present invention operates to produce photovoltaic quality, tetrahedrally coordinated amorphous alloys characterized by a low density of defect states in the band gaps thereof has been detailed, and (2) the apparatus for the production of said photovoltaic quality, tetrahedrally coordinated amorphous alloys has been described, an explanation of some of the experimental results achieved through the use of the claimed method will be set forth.

EXPERIMENTAL RESULTS

Pure crystals of the precursor material are placed in the crucible 28 which is disposed within the deposition chamber 12. The temperature controllers 11 are energized to heat the chamber 12 for initiating the contaminant removal process and the ultrahigh vacuum pumps 14 are activated to initiate the vacuumizing procedure. When the deposition chamber 12 has been lowered to a pressure of less than $10^{-10}$ torr, the substrate temperature control 16b is employed to set the temperature of the substrate 16 to approximately $-25°$ C. This temperature was experimentally found to provide an optimum ratio of light conductivity to dark conductivity (under AM1 conditions) of the amorphous silicon and germanium materials. In retrogression, the ratio of light to dark conductivity is proportional to the density of defect states in the energy gap of a given amorphous material, and hence the ratio provides a measurement of the quality of that amorphous material. More particularly, the lower the dark conductivity of an amorphous material, the lower the density of defect states at the Fermi level of that material, because the dark conductivity is proportional to the hopping conductance at the Fermi level.

Continuing with the process, the substrate temperature having been set, the evaporator 28b is energized to vaporize the precursor silicon or germanium crystals 26 from the crucible 28 and deposit a layer of porous, reactive, unadulterated amorphous material 18, onto the surface of the substrate 16. The thickness of the deposited layer of amorphous material may vary from 1000 angstroms to 1 micron. It is important to note that the thinner the layer, the more readily the density of states reducing element will diffuse completely therethrough. The density of states reducing element from the fluorine source 20, and/or the hydrogen source 22, and/or the other density of states reducing element source 24 is introduced into the deposition chamber, in molecular form and at a pressure of about $6 \times 10^{-3}$ torr, for absorption by the deposited reactive amorphous material 18 at approximately room temperature. The porous, reactive amorphous material 18, being unable to satisfy its bonding requirements due to the contaminant free environment, hungrily accepts the diffusion of the density of states reducing element thereinto. Subsequent annealing of the amorphous alloy at a temperature ranging from 300° to 350° C. for amorphous silicon alloys to approximately 200° C. for amorphous germanium alloys, enhances diffusion of the density of states reducing element through the alloy. It is at this point that the dark conductivity is measured to determine the ability of a given density of states reducing element to remove defects by moving the Fermi level toward the center of the bandgap and removing cites which participate in hopping conductivity.

Figure 7:
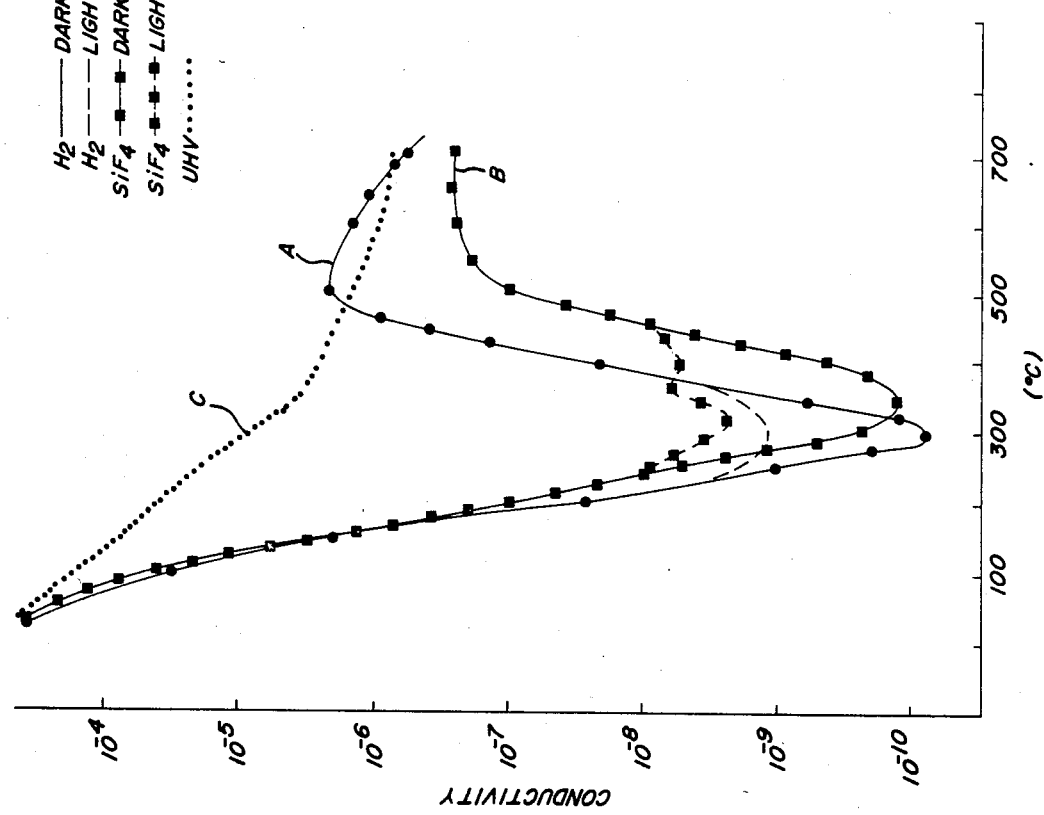
FIG. 7 is a graph illustrating the change in light and dark conductivity versus annealing temperature for various amorphous silicon alloys.

Referring now to FIG. 7, the graph found therein, plots the log of light and dark conductivity in (ohms-cm)$^{-1}$ versus annealing temperature in °C. for amorphous silicon alloyed with (1) hydrogen gas (see line A) and (2) silicon tetrafluoride (see line B). The result is that the amorphous silicon:fluorine alloy has a slightly better ratio of light to dark conductivity than the amorphous silicon:hydrogen alloy, and therefore provides the better photovoltaic material. This experiment did not attempt to have the defect removing element also relax strain in the amorphous material, and therefore does not realize the full beneficial effect which can be attained by the method described herein. Nonetheless, the resultant amorphous silicon:fluorine alloy is equivalent to the best material made by sputtering or glow deposition processes. Line C in the graph of FIG. 7 represents an amorphous silicon material formed in the prescribed manner, but annealed without the introduction of a density of states reducing element. It is by far and away the poorest of the illustrated samples. One final noteworthy statement should be made, i.e., the increase in conductivity which occurs when the optimum annealing temperature is exceeded, is due to the effusion of the density of states reducing element from the amorphous alloy.

Figure 8:
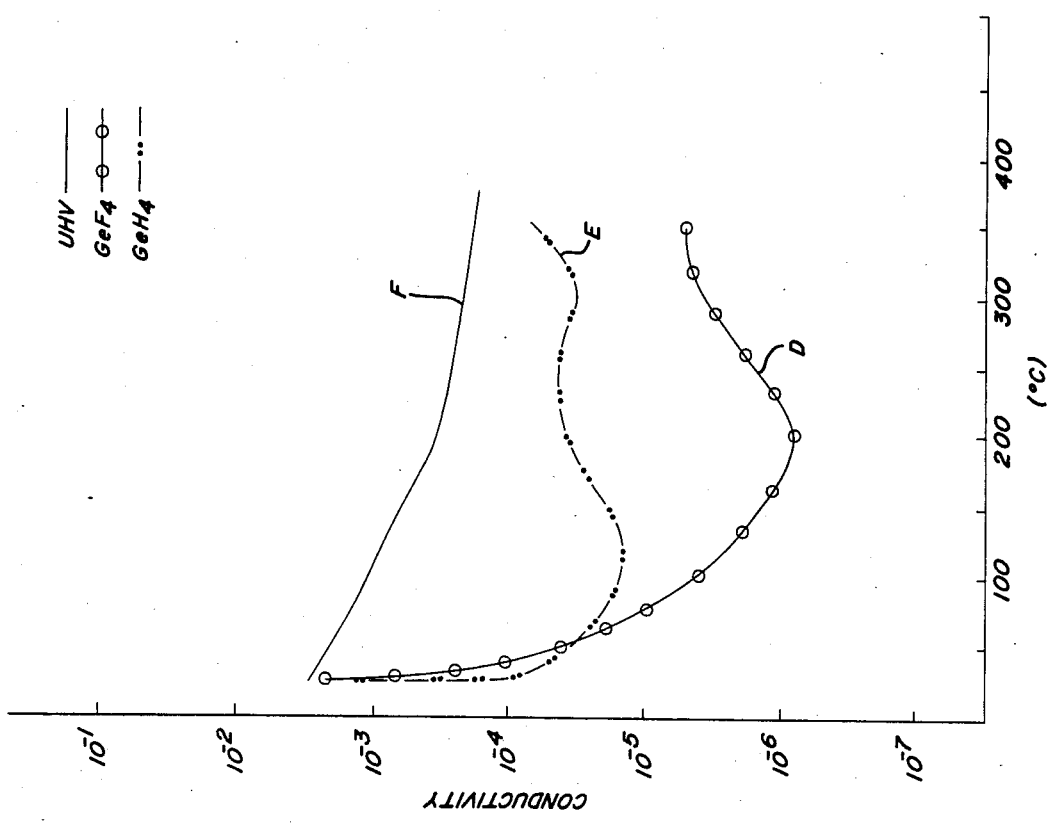
FIG. 8 is a graph showing the change in dark conductivity versus annealing temperature for various amorphous germanium alloys.

FIG. 8 illustrates a graph on which is plotted the log of dark conductivity in $(ohm-cm)^{-1}$ versus annealing temperature in °C. for amorphous germanium alloyed with (1) germanium tetrafluoride (see line D), and (2) germane (see line E). Also shown in that graph is line F which represents an amorphous germanium material formed as described hereinabove, but annealed without the introduction of a density of states reducing element. As can be seen from the graph of FIG. 8, a dramatic improvement is provided by the introduction of fluorine into the amorphous germanium material. It is noteworthy that in contrast to the amorphous silicon alloy of FIG. 7 where the large electronegativity of the defect removing element is much less critical to the process of removing defect states, the amorphous germanium alloy benefits greatly from the presence of fluorine to reduce dangling bonds and other defect states to an extent which hydrogen is unable to match. As with the previous example, strain was not relaxed in the amorphous alloys and therefore the experimental data does not reveal the total reduction of defect states which is possible by utilizing the techniques described herein.

Finally, turning to the graph found in FIG. 9, the log of dark conductivity in $(ohms-cm)^{-1}$ is plotted against annealing temperature in °C. of amorphous silicon alloys. Line G indicates the curve for an amorphous silicon:hydrogen alloy in which the hydrogen was not diffused into the amorphous silicon until after the amorphous silicon was annealed for one hour at 350° C. The conclusion to be derived from these plots is that once the pores of the reactive amorphous material are closed, the density of states reducing element finds it extremely difficult to diffuse through the amorphous material and passivate the defects therein. Moreover, even when the temperature is significantly increased, the density of states reducing material is unable to permeate through the entire amorphous material, resulting in the fabrication of much poorer quality material (a conductivity value of $10^{-8}$) than that material produced when hydrogen diffuses through the amorphous material before the pores thereof are closed (a conductivity of $10^{-10}$).

The inescapable result is that amorphous alloys fabricated according to the principles of the instant invention exhibit proper tetrahedral coordination and a low density of defect states. Applicants have made use of the unacceptable porosity of low temperature, evaporation-produced amorphous materials to form photovoltaic quality amorphous alloys. And finally, Applicants have experimentally proved, that while the instant process can be utilized to produce high quality amorphous alloys, the use of fluorine as the density of states reducing element produces the best results. Accordingly, fluorine is indeed proved to be a super halogen.

The term "amorphous" as defined and used herein refers to an alloy or material which has long range disorder, although it may have short or intermediate order or even contain at times some crystalline inclusions.

Finally, it is to be understood that the foregoing description is to be regarded as exemplary rather than as a limitation on the scope of the present invention. It is the appended claims, including all equivalents, which are intended to define the scope of the present invention.

What is claimed and desired to be secured by Letters Patent of the United States is:

1. A method of fabricating amorphous semiconductor alloys which are characterized by a low density of defect states in the band gaps thereof, said method including the steps of:

forming unadulterated amorphous semiconductor material at a temperature of less than about 180° C. so that the amorphous semiconductor material is deposited in relatively porous form which is adapted to facilitate the chemical combination thereof with any available reactant;

maintaining said unadulterated relatively porous amorphous semiconductor material in an ultrahigh vacuum environment of less than $10^{-8}$ torr so that said environment is substantially free of all elemental reactants and other contaminants capable of competing for use of the valence electrons of said amorphous semiconductor material;

introducing at a pressure of about several m torr at least one density of states reducing element into the ultrahigh vacuum environment such that the at least one density of states reducing element is the only material present for chemical combination with the available valence electrons of the reactive amorphous semiconductor material; and difussing the at least one density of states reducing element substantially throughout the bulk of the reactive amorphous semiconductor material for passivating the defect states in the band gap of the amorphous semiconductor material to form an amorphous semiconductor alloy; and annealing the amorphous semiconductor alloy to complete diffusion of the at least one density of states reducing element, whereby a dense photovoltaic quality amorphous semiconductor alloy having a low density of defect states is fabricated.

2. A method as in claim 1, including the further step of selecting the amorphous semiconductor material from a group of precursor materials consisting essentially of: silicon, silicon and a dopant, germanium, germanium and a dopant, and combinations thereof.

3. A method as in claim 2, including the further step of selecting the at least one density of states reducing element from the group consisting essentially of: fluorine, hydrogen, oxygen, chlorine, and combinations thereof.

4. A method as in claim 3, wherein silicon is selected as the amorphous semiconductor material and fluorine is selected as the density of states reducing element.

5. A method as in claim 4, wherein the fluorine is introduced in an activated state.

6. A method as in claim 5, including the further step of exciting the amorphous silicon as the activated fluorine bonds with the valence electrons of the amorphous silicon.

7. A method as in claim 3, wherein silicon is selected as the amorphous semiconductor material and hydrogen is selected as the density of states reducing element.

8. A method as in claim 7, wherein the hydrogen is introduced in an activated state.

9. A method as in claim 8, including the further step of exciting the amorphous silicon as the activated hydrogen bonds with the valence electrons of the amorphous silicon.

10. A method as in claim 3, wherein silicon is selected as the amorphous semiconductor material and fluorine and hydrogen are selected as the density of states reducing elements.

11. A method as in claim 10, wherein the fluorine and hydrogen are introduced in activated states.

12. A method as in claim 11, including the further step of exciting the amorphous silicon as the activated fluorine and hydrogen bond with the valence electrons of the amorphous silicon.

13. A method as in claim 3, wherein germanium is selected as the amorphous semiconductor material and fluorine is selected as the density of states reducing element.

14. A method as in claim 13, wherein the fluorine is introduced in an activated state.

15. A method as in claim 14, including the further step of exciting the amorphous germanium as the activated fluorine bonds with the valence electrons of the amorphous germanium.

16. A method as in claim 3, wherein germanium is selected as the amorphous semiconductor material and hydrogen is selected as the density of states reducing element.

17. A method as in claim 16, wherein the hydrogen is introduced in an activated state.

18. A method as in claim 17, including the further step of exciting the amorphous germanium as the activated fluorine bonds with the valence electrons of the amorphous germanium.

19. A method as in claim 3, wherein germanium is selected as the amorphous semiconductor material and fluorine and hydrogen are selected as the density of states reducing elements.

20. A method as in claim 19, wherein the fluorine and hydrogen are introduced in activated states.

21. A method as in claim 20, including the further step of exciting the amorphous germanium as the activated fluorine and hydrogen bond with the valence electrons of the amorphous germanium.

22. A method as in claim 3, wherein the amorphous semiconductor material is formed by evaporating crystals of the semiconductor material in the ultrahigh vacuum environment.

23. A method as in claim 22, including the further step of activating the density of states reducing element as it is introduced.

24. A method as in claim 23, including the further step of activating the amorphous semiconductor material before the valence electrons thereof combine with the density of states reducing element.

25. A method as in claim 24, including the further step of introducing a strain-relieving element after bonding of the density of states reducing element and the amorphous semiconductor material so as to relax bonding stresses in the resultant alloy.

26. A method as in claim 3, including the further step of introducing a strain relieving element after the bonding of the density of states reducing element and the amorphous semiconductor material so as to relax bonding stresses in the resultant alloy.

27. A method as in claim 3, including the further step of utilizing the amorphous semiconductor alloy as at least a portion of a multi-layer alloy of successively deposited layers of opposite conductivities.

28. A method as in claim 27, including the further step of providing an intrinsic layer containing said amorphous semiconductor alloy between the layers of opposite conductivities.

29. A method as in claim 28, including the further steps of; utilizing at least one doping material to form the layers of opposite conductivities; and introducing the at least one doping element in substantially discrete layers.

30. A method as in claim 3, wherein the step of introducing the at least one density of states reducing element includes the further step of combining the amorphous semiconductor material and the at least one density of states reducing element in a tetrahedral bonding configuration.

31. A method as in claim 30, wherein the energy of the free pairs of valence electrons of the amorphous semiconductor material is elevated to provide for deposition of the amorphous semiconductor alloy in said tetrahedral bonding configuration.

32. A method as in claim 1, wherein the formation temperature is maintained at approximately $-25°$ C.

33. A method as in claim 1, including the further step of implanting ions into the annealed amorphous semiconductor alloy to additionally reduce defect states.

* * * * *